(12) United States Patent
Kim et al.

(10) Patent No.: US 10,032,854 B2
(45) Date of Patent: Jul. 24, 2018

(54) SEMICONDUCTOR INTEGRATED CIRCUIT DEVICE WITH A CAPACITOR HAVING HIGH CAPACITANCE

(71) Applicant: SK hynix Inc., Icheon-si, Gyeonggi-do (KR)

(72) Inventors: Jong Su Kim, Icheon-si Gyeonggi-do (KR); Dong Kun Lee, Icheon-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 78 days.

(21) Appl. No.: 14/955,364

(22) Filed: Dec. 1, 2015

(65) Prior Publication Data

US 2017/0053978 A1    Feb. 23, 2017

(30) Foreign Application Priority Data

Aug. 18, 2015  (KR) .................. 10-2015-0116107

(51) Int. Cl.
| | | |
|---|---|---|
| *H01L 27/108* | (2006.01) | |
| *H01L 29/94* | (2006.01) | |
| *H01L 49/02* | (2006.01) | |
| *H01L 27/11582* | (2017.01) | |

(52) U.S. Cl.
CPC ........ *H01L 28/60* (2013.01); *H01L 27/11582* (2013.01); *H01L 28/00* (2013.01)

(58) Field of Classification Search
CPC .............. H01L 28/60; H01L 27/10835; H01L 27/10894; H01L 27/10808; H01L 27/10855; H01L 27/10852; H01L 29/66174; H01L 29/66189

USPC .................................................. 257/296–311
See application file for complete search history.

(56) References Cited

U.S. PATENT DOCUMENTS

| | | | | |
|---|---|---|---|---|
| 5,949,156 | A * | 9/1999 | Groover | H01L 27/0805 257/E27.048 |
| 8,957,740 | B2 | 2/2015 | Gaied et al. | |
| 2004/0174151 | A1* | 9/2004 | Moon | H02M 3/156 323/282 |
| 2005/0063134 | A1* | 3/2005 | Kim | H01L 23/5223 361/301.2 |
| 2006/0133132 | A1* | 6/2006 | Kang | G11C 11/4076 365/149 |
| 2010/0014041 | A1* | 1/2010 | Park | G02F 1/133707 349/143 |
| 2013/0026549 | A1* | 1/2013 | Kim | H01L 27/10852 257/296 |
| 2013/0026551 | A1* | 1/2013 | Kim | H01L 27/0733 257/296 |
| 2014/0009200 | A1* | 1/2014 | Kay | H03K 5/14 327/281 |

(Continued)

*Primary Examiner* — Lex Malsawma
*Assistant Examiner* — Nduka Ojeh
(74) *Attorney, Agent, or Firm* — William Park & Associates Ltd.

(57) ABSTRACT

A semiconductor integrated circuit device may include a cell capacitor connected with any one of a first electrode and a second electrode of an access device. The cell capacitor may include a first cell cap array and a second cell cap array separated from the first cell cap array. A voltage terminal for driving the cell capacitor may be connected to a connection node between the first cell cap array and the second cell cap array.

17 Claims, 9 Drawing Sheets

(56) References Cited

U.S. PATENT DOCUMENTS

2015/0200079 A1* 7/2015 Bhutta .............. H01J 37/32183
438/10

* cited by examiner

SEMICONDUCTOR INTEGRATED CIRCUIT DEVICE WITH A CAPACITOR HAVING HIGH CAPACITANCE

CROSS-REFERENCES TO RELATED APPLICATION

The present application claims priority under 35 U.S.C. § 119(a) to Korean application number 10-2015-0116107, filed on Aug. 18, 2015, in the Korean Intellectual Property Office, which is incorporated herein by reference in its entirety.

BACKGROUND

1. Technical Field

Various embodiments generally relate to a semiconductor integrated circuit device, more particularly, to a semiconductor integrated circuit device with a capacitor having high reliability and high capacitance.

2. Related Art

As a semiconductor integrated circuit devices are more highly integrated, a capacitors for storing massive data in a restricted area are needed.

Recently, pluralities of storage electrodes are being arranged between a single plate electrode and a single storage node to form the micro-farad of a massive capacitor.

In order to increase a surface area of the storage electrode, the storage electrodes may have a cylindrical shape. Thus, the cylindrical storage electrodes may have a vertical height relatively greater than a contact area of the storage node so that the cylindrical storage electrodes may have an unstable structure.

The unstable structure of the cylindrical storage electrodes may cause an electrical short with adjacent storage electrodes and may cause the cylindrical storage electrodes to collapse. As a result, the capacitors may have deteriorated electrical characteristics causing the memory devices to have lower reliabilities.

SUMMARY

According to an embodiment, there may be provided a semiconductor integrated circuit device. The semiconductor integrated circuit device may include a cell capacitor connected with any one of a first electrode and a second electrode of an access device. The cell capacitor may include a first cell cap array and a second cell cap array separated from the first cell cap array. A voltage terminal for driving the cell capacitor may be connected to a connection node between the first cell cap array and the second cell cap array.

According to an embodiment, there may be provided a semiconductor integrated circuit device. The semiconductor integrated circuit device may include a cell capacitor connected with any one of a first electrode and a second electrode of an access element. The cell capacitor may include a plurality of cell cap arrays separated from each other. A voltage terminal for driving the cell capacitor may be connected to a connection node between the cell cap arrays.

DETAILED DESCRIPTION

Figure 1:
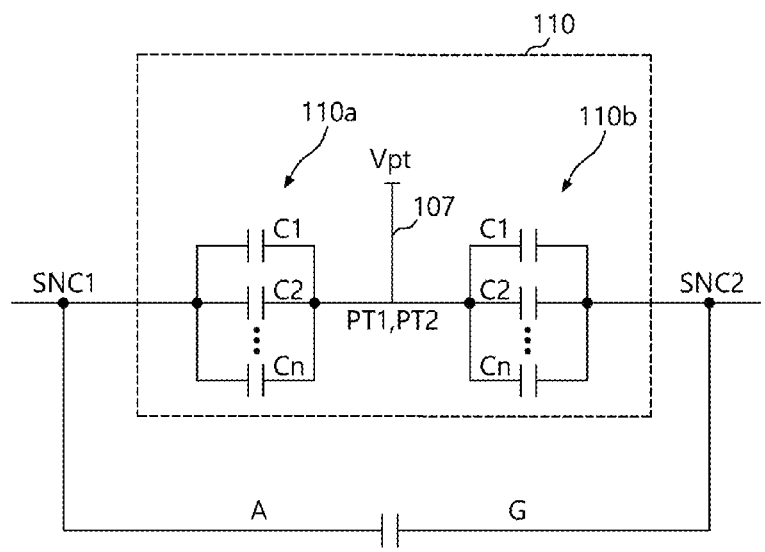
FIG. 1 is an equivalent circuit diagram illustrating a representation of an example of a semiconductor integrated circuit device in accordance with an embodiment.

Various examples of embodiments will be described hereinafter with reference to the accompanying drawings, in which some examples of the embodiments are illustrated. The embodiments may, however, be embodied in many different forms and should not be construed as limited to the examples of embodiments set forth herein. Rather, these examples of embodiments are provided so that this disclosure will be thorough and complete, and will fully convey the scope of the present disclosure to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present disclosure.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the example of the term "below" can encompass both an orientation of above and below. The device may be otherwise oriented (rotated 90 degrees or at other orientations) and the spatially relative descriptors used herein interpreted accordingly.

The terminology used herein is for the purpose of describing particular examples of embodiments only and is not intended to be limiting of the present disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Examples of the embodiments are described herein with reference to cross-sectional illustrations that are schematic illustrations of idealized examples of embodiments (and intermediate structures). As such, variations from the shapes of the illustrations as a result, for example, of manufacturing techniques and/or tolerances, are to be expected. Thus, examples of the embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present disclosure.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, examples of the embodiments will be explained with reference to the accompanying drawings.

FIG. 1 is an equivalent circuit diagram illustrating a representation of an example of a semiconductor integrated circuit device in accordance with an embodiment.

Referring to FIG. 1, a cell capacitor 110 may be formed between a first storage node SNC1 and a second storage node SNC2. The cell capacitor 110 may include a first cell cap array 110a and a second cell cap array 110b. A plate electrode PT (i.e., PT1 and PT2) may be formed between the first cell cap array 110a and the second cell cap array 110b.

Figure 2:
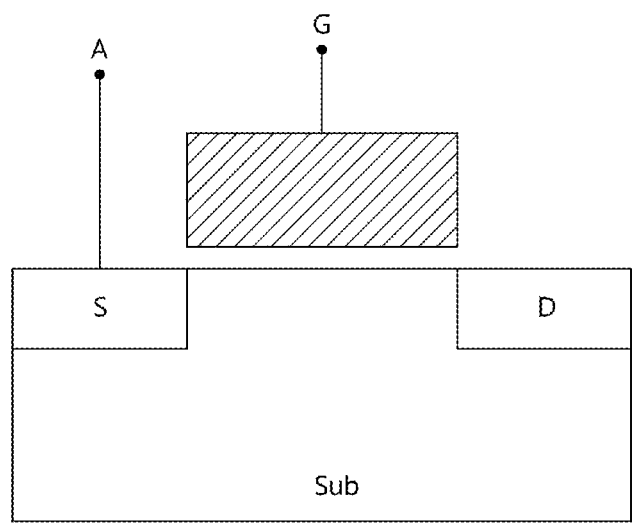
FIG. 2 is a cross-sectional view illustrating a representation of an example of an access element in accordance with an embodiment.

FIG. 2 is a cross-sectional view illustrating a representation of an example of an access element in accordance with an embodiment.

Referring to FIG. 2, the first storage node SNC1 may be electrically connected with a junction region A of a MOS transistor used as an access device. A connection wiring may be formed between the first storage node SNC1 and the junction region A through other conductive patterns, for example, a first electrode or a bit line contact, etc. The second storage node SNC2 may be electrically connected with a gate G of the MOS transistor. A connection wiring may be formed between the second storage node SNC2 and the gate G through other conductive patterns (i.e., a second electrode). Referring to FIG. 2, a reference numeral Sub may indicate a substrate of the MOS transistor, a reference numeral S may indicate a source junction region, and a reference numeral D may indicate a drain junction region.

Figure 3:
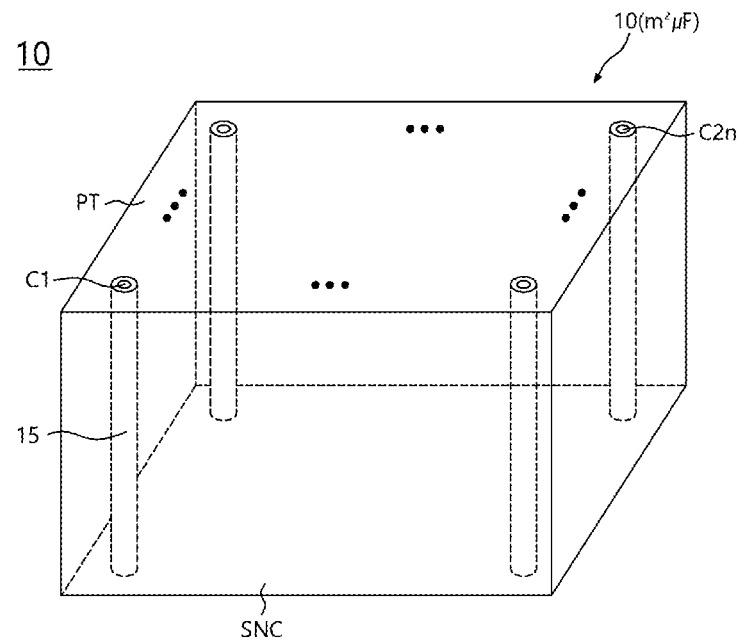
FIG. 3 is a perspective view illustrating a representation of an example of a general cell capacitor.
Figure 4:
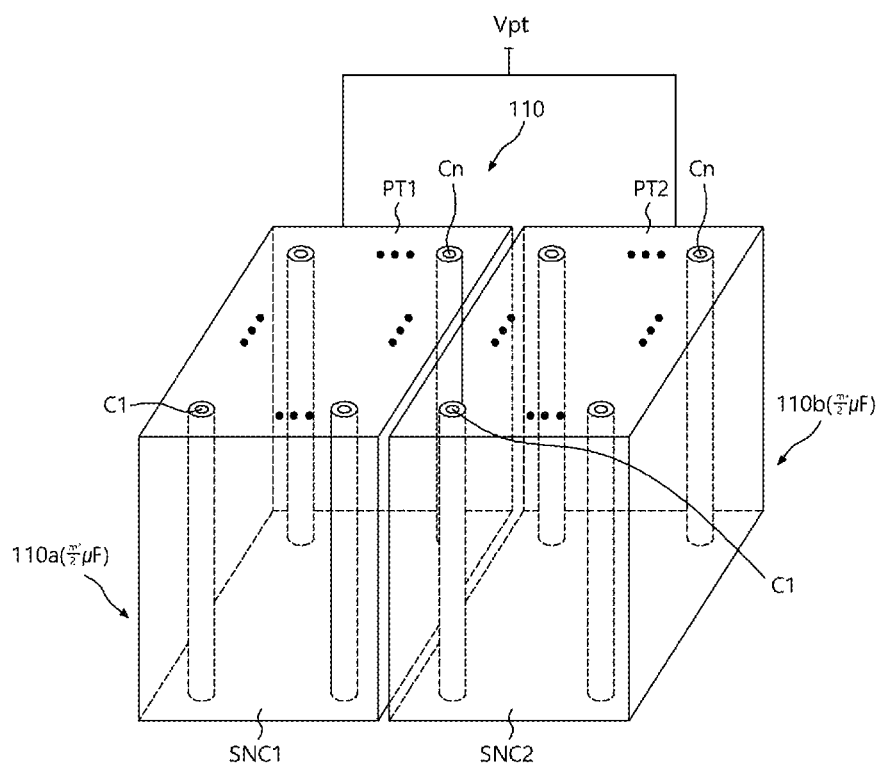
FIG. 4 is a perspective view illustrating a representation of an example of a cell capacitor in accordance with an embodiment.

FIG. 3 is a perspective view illustrating a representation of an example of a general cell capacitor.

Referring to FIG. 3, a general cell capacitor 10 (hereinafter referred to as a single capacitor) may include a plurality of storage electrodes 15 between a single storage node SNC and a single plate electrode PT. However, when an error may be generated in any one of the storage electrodes 15, the cell capacitor 10 may malfunction.

Referring to FIGS. 1 to 4, when, for example, the cell capacitor 10 is divided into the first cell cap array 110a and the second cell cap array 110b in accordance with the examples of the embodiments, the malfunction of the cell capacitor 10 may be decreased to no less than about 50%.

The first cell cap array 110a may include a first storage node SNC1, a first plate electrode PT1 and a plurality of first storage electrodes C1-Cn. The first plate electrode PT1 may face the first storage node SNC1. The first storage electrodes C1-Cn may be arranged between the first storage node SNC1 and the first plate electrode PT1.

Referring to FIG. 1, the first storage node SNC1 may correspond to a node. However, in FIG. 3, the first storage node SNC1 may also correspond to a storage node pad having an area. The first storage node SNC1 may have an area of half of an area of the single storage node SNC. The first plate electrode PT1 may have an area of half of the areas of the single storage node SNC. Numbers of the first cell storage electrodes C1-Cn may be half the number of storage electrodes in FIG. 2.

The second cell cap array 110b may include a second storage node SNC2, a second plate electrode PT2 and a plurality of second storage electrodes C1-Cn. The second plate electrode PT2 may face the second storage node SNC2. The second storage electrodes C1-Cn may be arranged between the second storage node SNC2 and the second plate electrode PT2.

The second storage node SNC2 may also correspond to a storage node pad having an area similarly to the first storage node SNC1. The second storage node SNC2 may have an area of half of the area of the single storage node SNC. The second plate electrode PT2 may have an area of half of the areas of the single storage node SNC. Numbers of the second cell storage electrodes C1-Cn may be half the number of storage electrodes 15 in the single cell capacitor 10 in FIG. 2.

For example, when a capacitance of the single capacitor in FIG. 3 is $m^2$ μF (m may be a natural number), a capacitance of the first cell cap array 110a between the first storage node SNC1 and the first plate electrode PT1 and a capacitance of the second cell cap array 110b between the second storage node SNC2 and the second plate electrode PT2 may be $(m^2/2)$ μF, respectively.

The first and second plate electrodes PT1 and PT2 may be commonly connected to a plate voltage terminal Vpt. The first and second plate electrodes PT1 and PT2 may include separated patterns. The first and second plate electrodes PT1 and PT2 may be connected to the plate voltage terminal Vpt through a wiring 107.

Figure 5:
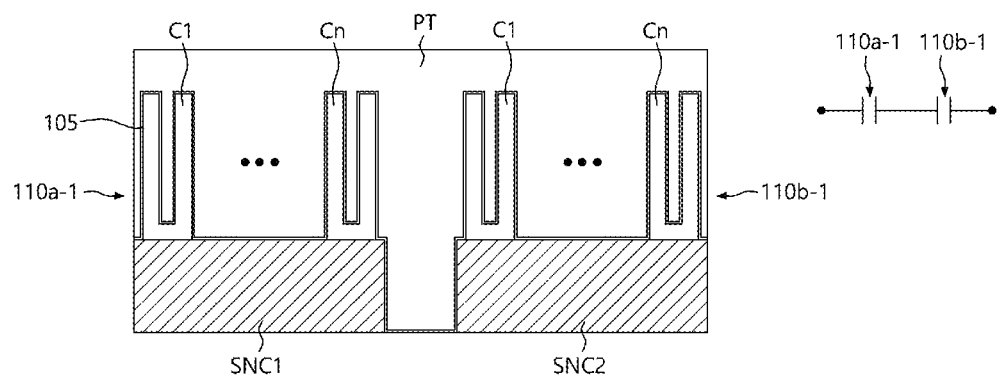
FIG. 5 is a cross-sectional view illustrating a representation of an example of a cell capacitor.

Referring to FIG. 5, when only the storage node SNC may include the first and second storage nodes SNC1 and SNC2 and the plate electrode PT may include a single plate, the first cell cap array 110a-1 and the second cell cap array 110b-1 may be serially connected with each other. Thus, the capacitor in FIG. 5 may have a capacitance of $(m^2/4)$ μF which is less than a capacitance of the single cell capacitor 10.

However, when the plate electrode is divided into the first plate electrode PT1 and the second plate electrode PT2 as well as the first and second storage nodes SNC1 and SNC2 in accordance with an example of the embodiments, the first cell cap array 110a and the second cell cap array 110b may be connected in parallel. Thus, a total capacitance of the first and second cell cap arrays 110a and 110b may be $m^2$ μF which is substantially the same as the capacitance of the single capacitor.

According to an example of the embodiments, the storage node and the plate electrode may be divided into the two nodes and the two electrodes. Although an error may be generated in any one of the storage electrodes, the rest of the cell cap array may be normally operated so that the cell capacitor may have improved reliability without decreasing of the capacitance.

Figure 6:
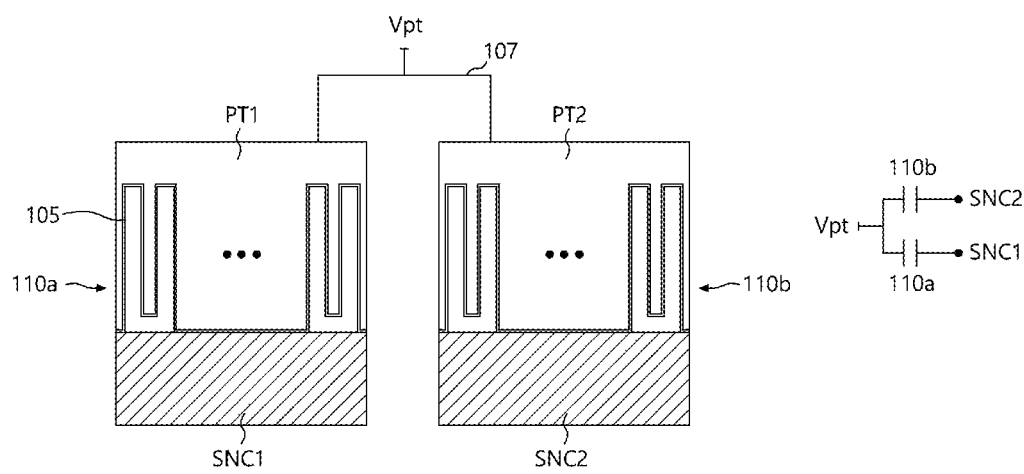
FIG. 6 is a cross-sectional view illustrating a representation of an example of a cell capacitor in accordance with an embodiment.

Referring to FIGS. 5 and 6, a reference numeral 105 may indicate a dielectric layer interposed between the storage electrodes C1-Cn and the first and second plate electrodes PT1 and PT2.

Figure 7:
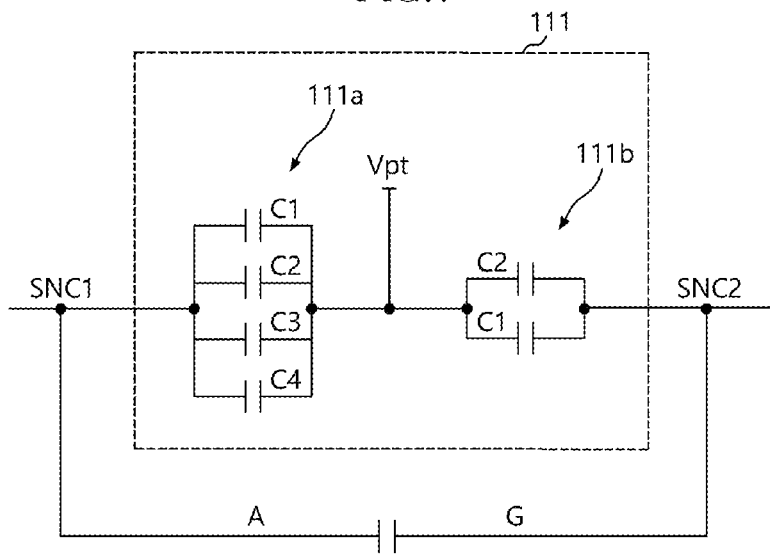
FIG. 7 is an equivalent circuit diagram illustrating a representation of an example of a semiconductor integrated circuit device in accordance with an embodiment.

In examples of the embodiments, the first and second cell cap arrays 110a and 110b in the cell capacitor 110 may have substantially the same capacitance. Alternatively, referring to FIG. 7, the first and second cell cap arrays 111a and 111b in the cell capacitor 111 may have different capacitances.

In this example, the different capacitance may be provided to the first and second call cap arrays 111a and 111b by setting an area of the first storage node SNC1 different from an area of the second storage node SNC2 or numbers of the storage electrodes C1-Cn by arrays.

Figure 8:
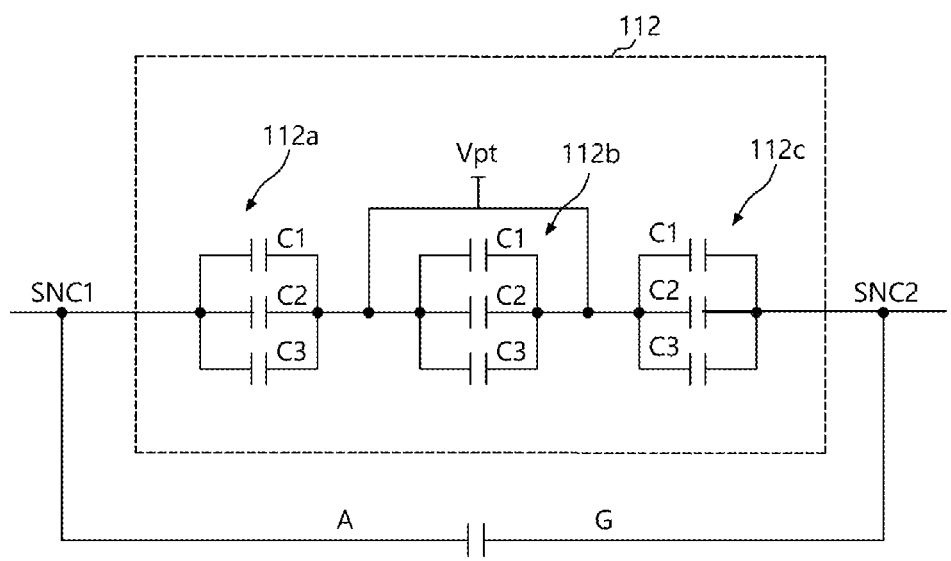
FIG. 8 is an equivalent circuit diagram illustrating a representation of an example of a semiconductor integrated circuit device in accordance with an embodiment.

Referring to FIG. 8, a cell capacitor 112 may include at least two cell cap arrays 112a-112c. Connection nodes of the at least two cell cap arrays 112a-112c may be commonly connected to the plate voltage terminal Vpt. Plate electrodes of the at least two cell cap arrays 112a-112c may be separated from each other.

Figure 9:
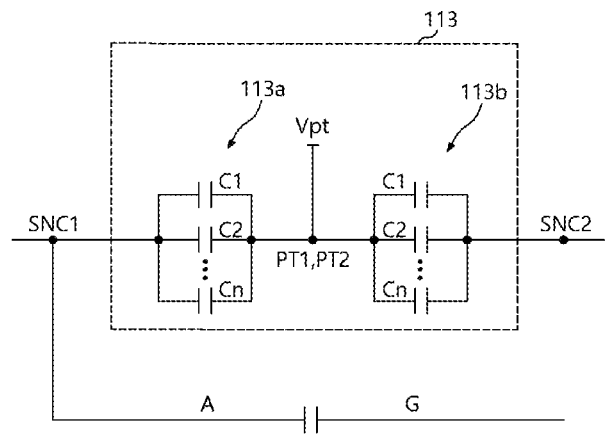
FIG. 9 is an equivalent circuit diagram illustrating a representation of an example of a semiconductor integrated circuit device in accordance with an embodiment.

Referring to FIG. 9, a cell capacitor 113 divided into a first cell cap array 113a and a second cell cap array 113b may have an open type. Any one selected from the first storage node SNC1 and the second storage node SNC2 may be connected to any one of the junction region A of the access element or the gate G. A non-selected one of the first storage node SNC1 and the second storage node SNC2 may be floated. Referring to FIG. 9, the first storage node SNC1 may be connected to the junction region A. The second storage node SNC2 may be floated, not connected to the gate G.

Figure 10:
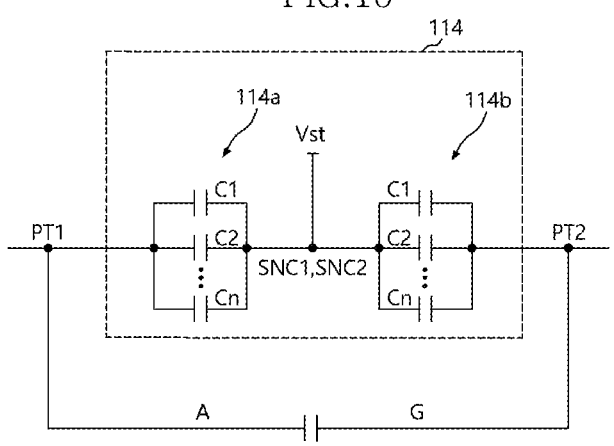
FIG. 10 is an equivalent circuit diagram illustrating a representation of an example of a semiconductor integrated circuit device in accordance with an embodiment.

Referring to FIG. 10, a cell capacitor 114 divided into a first cell cap array 114a and a second cell cap array 114b may be formed between the first plate electrode PT1 and the second plate electrode PT2. The first cell cap array 114a and the second cell cap array 114b may be connected to the storage voltage terminal Vst.

Particularly, the first plate electrode PT1 of the first cell cap array 114a may be connected to the junction region A of the MOS transistor. The first storage electrode SNC1 of the first cell cap array 114a may be connected to the storage voltage terminal Vst.

The second plate electrode PT2 of the second cell cap array 114b may be connected to the gate G of the MOS transistor. The second storage electrode SNC2 of the second cell cap array 114b may be connected to the storage voltage terminal Vst.

The first and second storage electrodes SNC1 and SNC2 commonly connected to the storage voltage terminal Vst may be separated from each other so that the first and second cell cap arrays 114a and 114b may be connected in parallel with each other.

Figure 11:
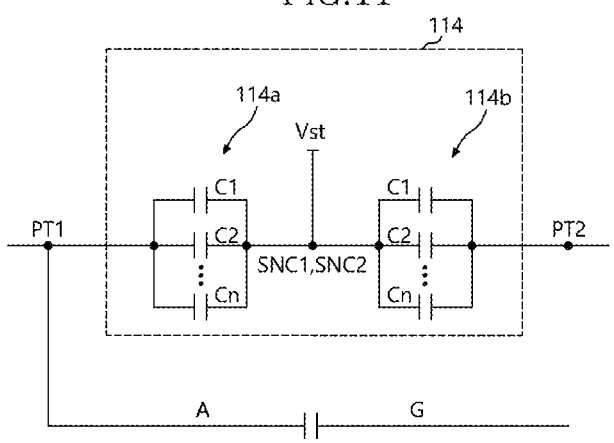
FIG. 11 is an equivalent circuit diagram illustrating a representation of an example of a semiconductor integrated circuit device in accordance with an embodiment.

Referring to FIG. 11, the second plate electrode PT2 of the second cell cap array 114b and the gate G may be floated, not connected with each other.

Figure 12:
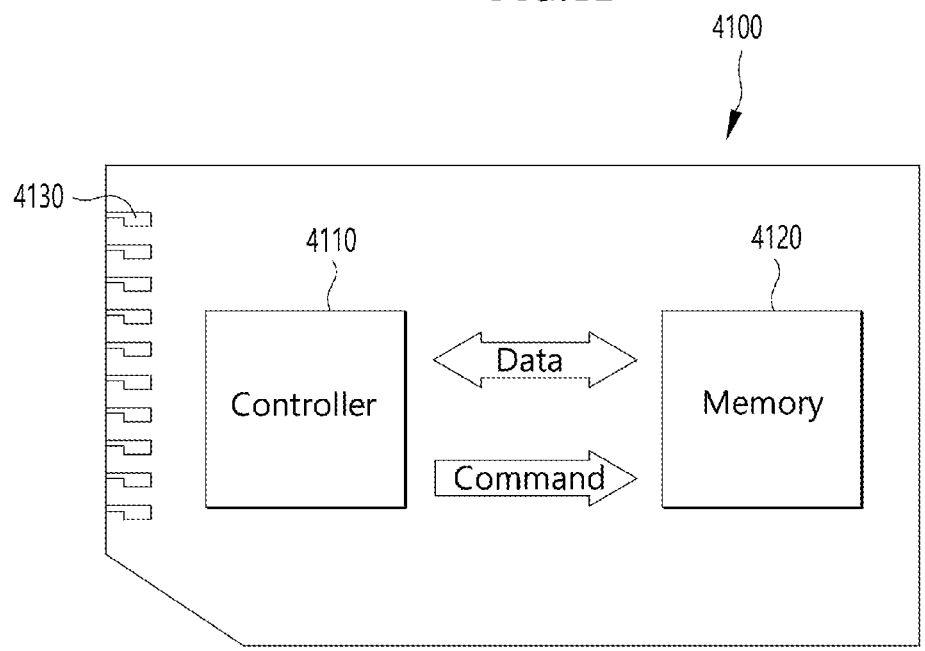
FIG. 12 is a schematic diagram illustrating a representation of an example of a representation of an example of a memory card according to an embodiment of the present disclosure.

Referring to FIG. 12, a schematic diagram illustrating a representation of an example of a memory card having a semiconductor integrated circuit device according to various embodiments of the present disclosure are described.

Referring to FIG. 12, a memory card system 4100 including a controller 4110, a memory 4120, and an interface member 4130 may be provided. The controller 4110 and the memory 4120 may be configured to exchange a command and/or data. For example, the memory 4120 may be used to store a command to be executed by the controller 4110 and/or user data.

The memory card system 4100 may store data in the memory 4120 or output data from the memory 4120 to the outside. The memory 4120 may include the semiconductor integrated circuit device according to any one of the above-described embodiments. The controller 4110 may transmit a test command to a probe test pad in an embodiment of the inventive concept. Further, a non-contact test between the probe test pad and a probe card may be performed.

The interface member 4130 may function to input and output data from and to the outside. The memory card system 4100 may be a multimedia card (MMC), a secure digital card (SD) or a portable data storage device.

Figure 13:
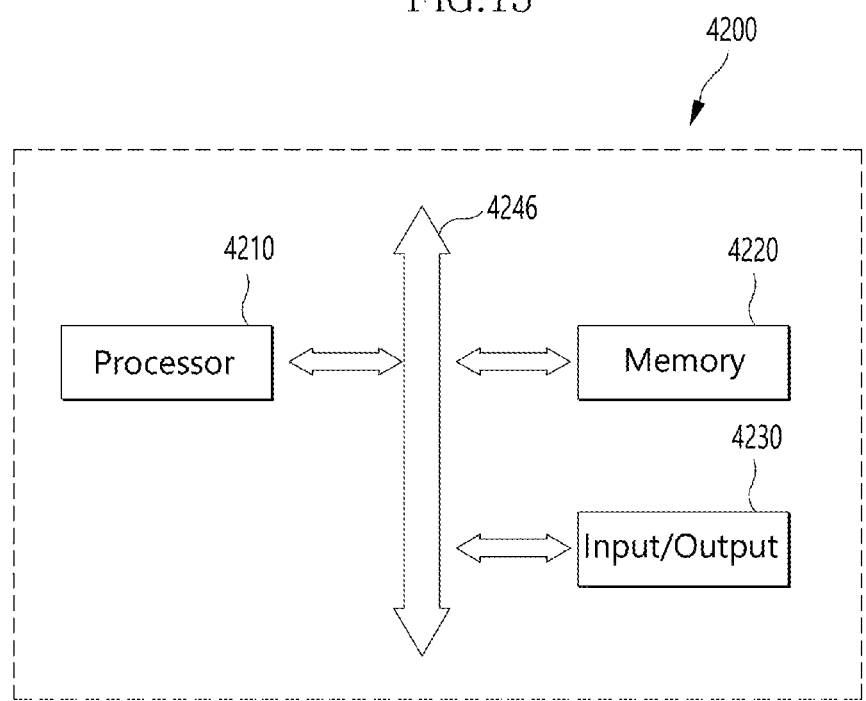
FIG. 13 is a block diagram illustrating a representation of an example of an electronic system according to an embodiment of the present disclosure.

Referring to FIG. 13, a block diagram illustrating a representation of an example of an electronic apparatus having a semiconductor integrated circuit device according to various embodiments of the disclosure is described.

Referring to FIG. 13, an electronic apparatus 4200 including a processor 4210, a memory 4220, and an input/output (I/O) device 4230 may be provided. The processor 4210, the memory 4220, and the I/O device 4230 may be electrically coupled through a bus 4246.

The memory 4220 may receive a control signal from the processor 4210. The memory 4220 may store a code and data for the operation of the processor 4210. The memory 4220 may be used to store data to be accessed through the bus 4246.

The memory 4220 may include the semiconductor integrated circuit device according to any one of the above-described embodiments. In order for detailed realization and modification, additional circuits and control signals may be provided.

The electronic apparatus 4200 may constitute various electronic control apparatuses which need the memory 4220. For example, the electronic apparatus 4200 may be used in a computer system or a wireless communication device, such as a personal digital assistant (PDA), a laptop computer, a portable computer, a web tablet, a wireless phone, a portable phone, a digital music player, an MP3 player, a navigator, a solid state disk (SSD), a household appliance, or any device capable of transmitting and receiving information under wireless circumstances.

Descriptions will be made below for the realization and modified examples of the electronic apparatus 4200, with reference to FIGS. 14 and 15.

Figure 14:
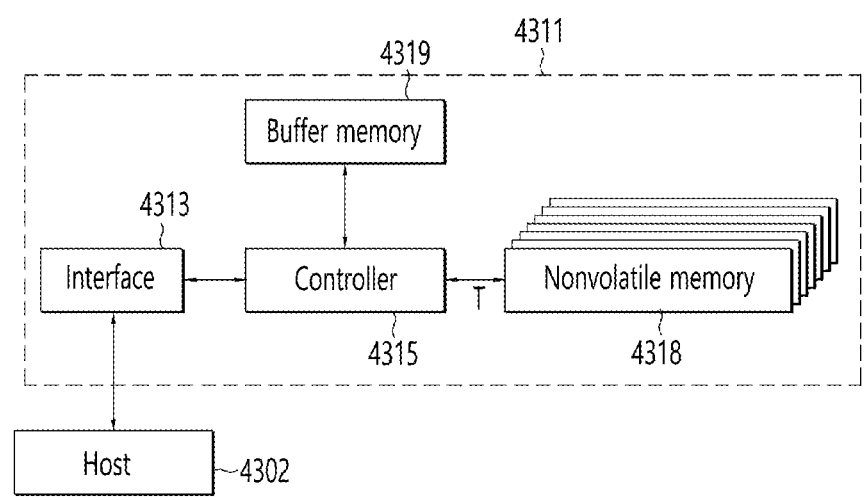
FIG. 14 is a block diagram illustrating a representation of an example of a data storage apparatus according to an embodiment of the present disclosure.

Referring to FIG. 14, a block diagram illustrating a representation of an example of a data storage apparatus having a semiconductor integrated circuit device according to various embodiments of the disclosure is described.

Referring to FIG. 14, a data storage apparatus 4311 such as a solid state disk (SSD) may be provided. The SSD 4311 may include an interface 4313, a controller 4315, a nonvolatile memory 4318, and a buffer memory 4319.

The SSD 4311 may be an apparatus which stores information using a semiconductor device. The SSD 4311 may be faster, may have a lower mechanical delay or failure rate. The SSD 4311 may also generate less heat and noise than a hard disk drive (HDD). Further, the SSD 4311 may be smaller and lighter than the HDD. The SSD 4311 may be widely used in a laptop PC, a net book, a desktop PC, an MP3 player, or a portable storage device.

The controller 4315 may be formed adjacent to the interface 4313 and may be electrically coupled to the interface 4313. The controller 4315 may be a microprocessor including a memory controller and a buffer controller. The nonvolatile memory 4318 may be formed adjacent to the controller 4315 and may be electrically coupled to the controller 4315 via a connection terminal T. The data storage capacity of the SSD 4311 may correspond to the nonvolatile memory 4318. The buffer memory 4319 may be formed adjacent to the controller 4315 and may be electrically coupled to the controller 4315.

The interface 4313 may be electrically coupled to a host 4302. The interface 4313 may also function to transmit and receive electrical signals such as data to and from the host 4302. For example, the interface 4313 may be a device which uses the same standard as SATA, IDE, SCSI, and/or a combination thereof. The nonvolatile memory 4318 may be electrically coupled to the interface 4313 via the controller 4315.

The nonvolatile memory 4318 may function to store the data received through the interface 4313.

The nonvolatile memory 4318 may include the semiconductor integrated circuit device according to any one of the above-described embodiments. The nonvolatile memory 4318 has a characteristic that the data stored is retained even when power supply to the SSD 4311 is interrupted.

The buffer memory 4319 may include a volatile memory. The volatile memory may be a DRAM and/or an SRAM. The buffer memory 4319 has relatively higher operation speed than the nonvolatile memory 4318.

The data processing speed of the interface 4313 may be relatively faster than the operation speed of the nonvolatile memory 4318. The buffer memory 4319 may function to temporarily store data. The data received through the interface 4313 may be temporarily stored in the buffer memory 4319 via the controller 4315. Further, the data may then be permanently stored in the nonvolatile memory 4318 in conformity with the data recording speed of the nonvolatile memory 4318.

The data frequently used among the data stored in the nonvolatile memory 4318 may be read in advance and may be temporarily stored in the buffer memory 4319. Namely, the buffer memory 4319 may function to increase the effective operation speed of the SSD 4311 and reduce an error occurrence rate.

Figure 15:
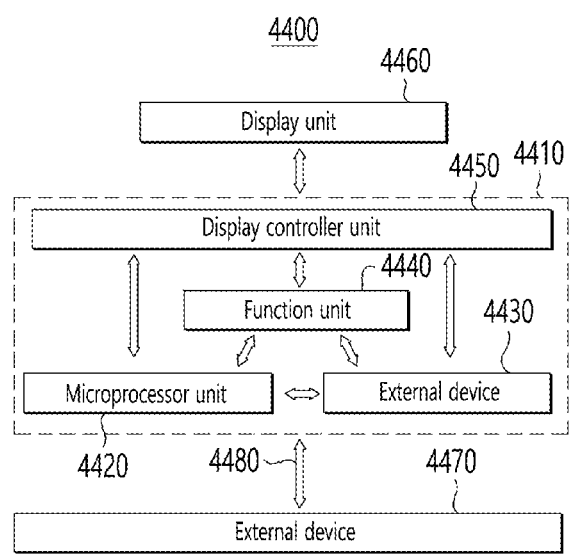
FIG. 15 is a block diagram illustrating a representation of an example of an electronic apparatus according to an embodiment of the present disclosure.

Referring to FIG. 15, a system block diagram illustrating a representation of an example of an electronic apparatus having a semiconductor integrated circuit device according to various embodiments of the disclosure is described.

Referring to FIG. 15, an electronic system 4400 including a body 4410, a microprocessor unit 4420, a power unit 4430, a function unit 4440, and a display controller unit 4450 may be provided.

The body 4410 may be a mother board formed of a printed circuit board (PCB). The microprocessor unit 4420, the power unit 4430, the function unit 4440, and the display controller unit 4450 may be mounted on the body 4410. A display unit 4460 may be disposed inside the body 4410 or outside the body 4410. For example, the display unit 4460 may be disposed on a surface of the body 4410. The display unit 4460 may also display the image processed by the display controller unit 4450.

The power unit 4430 may function to receive a voltage from an external battery or the like, divide the voltage into desired voltage levels, and supply divided voltages to the microprocessor unit 4420, the function unit 4440, the display controller unit 4450, and so forth. The microprocessor unit 4420 may receive a voltage from the power unit 4430 and control the function unit 4440 and the display unit 4460. The function unit 4440 may perform various functions of the electronic system 4400. For example, when the electronic system 4400 is a portable phone, the function unit 4440 may include various components capable of performing portable phone functions, such as output of an image to the display unit 4460 or output of a voice to a speaker, by dialing or communication with an external device 4470. When a camera may be mounted together, the function unit 4440 may serve as a camera image processor.

When the electronic system 4400 is electrically coupled to a memory card or the like to increase capacity, the function unit 4440 may be a memory card controller. The function unit 4440 may exchange signals with the external device 4470 through a wired or wireless communication unit 4480. When the electronic system 4400 may need a universal serial bus (USB) or the like to expand functions, the function unit 4440 may serve as an interface controller. Any one semiconductor integrated circuit device among the semiconductor integrated circuit devices according to the above-described embodiments may be applied to at least any one of the microprocessor unit 4420 and the function unit 4440.

The above embodiments of the present disclosure are illustrative and not limitative. Various alternatives and equivalents are possible. The examples of the embodiments are not limited by the embodiments described herein. Nor is the present disclosure limited to any specific type of semiconductor device. Other additions, subtractions, or modifications are obvious in view of the present disclosure and are intended to fall within the scope of the appended claims.

What is claimed is:

1. A semiconductor integrated circuit device comprising:
   a cell capacitor connected to any one of a first electrode and a second electrode of an access device,
   wherein the cell capacitor includes a first cell cap array and a second cell cap array separated from the first cell cap array, the cell capacitor being driven through a voltage terminal, the voltage terminal being connected to a connection node of the first cell cap array and the second cell cap array,
   wherein the first cell cap array and the second cell cap array are configured to be connected in parallel,
   wherein the first cell cap array and the second cell cap array are charged by driving of the access device through the voltage terminal, and
   wherein the connection node connects only two of the cell cap arrays and the voltage terminal.

2. The semiconductor integrated circuit device of claim 1, wherein the first cell cap array comprises a first storage node, a first plate electrode facing the first storage node, and a plurality of first storage electrodes interposed between the first storage node and the first plate electrode, and
   wherein the second cell cap array comprises a second storage node, a second plate electrode facing the second storage node, and a plurality of second storage electrodes interposed between the second storage node and the second plate electrode.

3. The semiconductor integrated circuit device of claim 2, wherein the first plate electrode is separated from the second plate electrode, and the first plate electrode and the second plate electrode are electrically connected with the voltage terminal through a wiring.

4. The semiconductor integrated circuit device of claim 3, wherein the voltage terminal comprises a plate voltage terminal.

5. The semiconductor integrated circuit device of claim 3, wherein the first storage node is connected to the first electrode, and the second storage node is connected to the second electrode, and
   wherein the first electrode comprises a junction region of a MOS transistor, and the second electrode comprises a gate of the MOS transistor.

6. The semiconductor integrated circuit device of claim 2, wherein the first storage node is separated from the second storage node, and the first storage node and the second storage node are electrically connected with the voltage terminal through a wiring.

7. The semiconductor integrated circuit device of claim 6, wherein the first plate electrode node is connected to the first electrode, and the second plate electrode is connected to the second electrode, and
   wherein the first electrode comprises a junction region of a MOS transistor, and the second electrode comprises a gate of the MOS transistor.

8. The semiconductor integrated circuit device of claim 1, wherein the voltage terminal comprises a storage voltage terminal.

9. The semiconductor integrated circuit device of claim 2, further comprising:
   a dielectric layer interposed between the first storage electrodes and the first plate electrodes, and between the second storage electrodes and the second plate electrode.

10. The semiconductor integrated circuit device of claim 2, wherein an area of the first storage node is different from an area of the second storage node, and
    wherein a number of first storage electrodes is different from a number of second storage electrodes.

11. The semiconductor integrated circuit device of claim 1, wherein the first cell cap array has a capacitance substantially the same as a capacitance of the second cell cap array.

12. The semiconductor integrated circuit device of claim 1, wherein the first cell cap array has a capacitance different from a capacitance of the second cell cap array.

13. A semiconductor integrated circuit device comprising:
    a cell capacitor connected to any one of a first electrode and a second electrode of an access device,
    wherein the cell capacitor includes a plurality of cell cap arrays separated from each other, and a connection node of the cell cap arrays is connected to a single voltage terminal,
    wherein the plurality of cell cap arrays are configured to be connected in parallel,
    wherein the plurality of cell cap arrays are charged by driving of the access device through the single voltage terminal, and
    wherein the connection node connects only two of the cell cap arrays and the voltage terminal.

14. The semiconductor integrated circuit device of claim 13, wherein each of the cell cap arrays comprises a storage node, a plate electrode facing the first storage node and connected to the voltage terminal, and a plurality of storage electrodes interposed between the storage node and the plate electrode.

15. The semiconductor integrated circuit device of claim 13, wherein a first cell cap array among the cell cap arrays is electrically connected to the first electrode, and a last cell cap array among the cell cap arrays is electrically connected to the second electrode.

16. The semiconductor integrated circuit device of claim 13, wherein a first cell cap array among the cell cap arrays is electrically connected to the first electrode, and an outer node of a last cell cap array among the cell cap arrays is floated.

17. The semiconductor integrated circuit device of claim 13, wherein the first electrode comprises a junction region of a MOS transistor, and the second electrode comprises a gate of the MOS transistor.

* * * * *